United States Patent [19]
Cronin et al.

[11] Patent Number: 5,126,006
[45] Date of Patent: Jun. 30, 1992

[54] PLURAL LEVEL CHIP MASKING

[75] Inventors: John E. Cronin, Milton; Paul A. Farrar, Sr.; Robert M. Geffken, both of Burlington; William H. Guthrie, Essex Junction; Carter W. Kaanta, Colchester; Rosemary A. Previti-Kelly, Richmond; James G. Ryan; Ronald R. Uttecht, both of Essex Junction; Andrew J. Watts, Milton, all of Vt.

[73] Assignee: International Business Machines Corp., Armonk, N.Y.

[21] Appl. No.: 708,608

[22] Filed: May 31, 1991

Related U.S. Application Data

[63] Continuation-in-part of Ser. No. 605,606, Oct. 30, 1990.

[51] Int. Cl.$^5$ .............. B44C 1/22; C03C 15/00; B29C 37/00; C23F 1/00
[52] U.S. Cl. .............. 156/643; 156/644; 156/651; 156/656; 156/657; 156/661.1; 156/668; 430/296; 430/312; 430/316; 430/317
[58] Field of Search ............... 156/643, 644, 646, 651, 156/652, 655, 656, 657, 659.1, 661.1, 662, 663, 668; 204/192.32, 192.36, 192.37; 430/5, 296, 312, 313, 314, 316, 317, 318, 323, 329

[56] References Cited

U.S. PATENT DOCUMENTS 4,040,891  8/1977  Chang et al. ............... 156/661.1 X
4,770,739  9/1988  Orvek et al. ............... 156/643

Primary Examiner—William A. Powell
Attorney, Agent, or Firm—Perman & Green

[57] ABSTRACT

A sequence of masking steps reduces the amount of transference of a workpiece among work stations and reduces certain tolerances required for mask alignment in the construction of integrated circuits, and a gray level mask suitable for photolithography. In the integrated circuit, masking layers are developed directly in a wafer for delineating vertical and horizontal portions of an electrically conductive path. The mask is constructed of a transparent glass substrate which supports plural levels of materials having different optical transmissivities. In the case of a mask employing only two of these levels, one level may be constructed of a glass made partially transmissive by substitution of silver ions in place of metal ions of alkali metal silicates employed in the construction of the glass. The second layer may be made opaque by construction of the layer of a metal such as chromium. Both the wafer and the mask are fabricated by a photoresist structure which is etched in specific regions by photolithographic masking to enable selective etching of exposed regions of the level of materials of differing optical transmissivities. Various etches are employed for selective etching of the photoresist and other ones of the layers. The etches include plasma etch with chloride ions to attack the chromium of the opaque layer, compounds of fluorine to attack the glass layer, and reactive ion etching with oxygen to attack the photoresist structure.

35 Claims, 9 Drawing Sheets

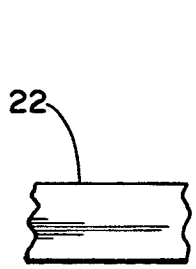
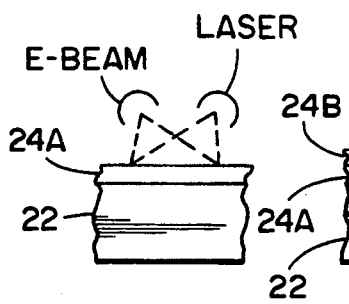
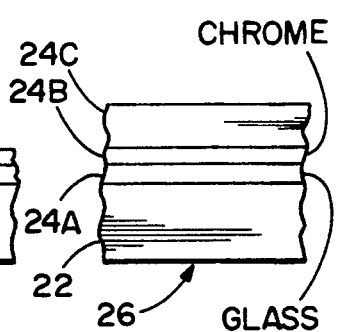
FIG. 1  FIG. 2  FIG. 3  FIG. 4
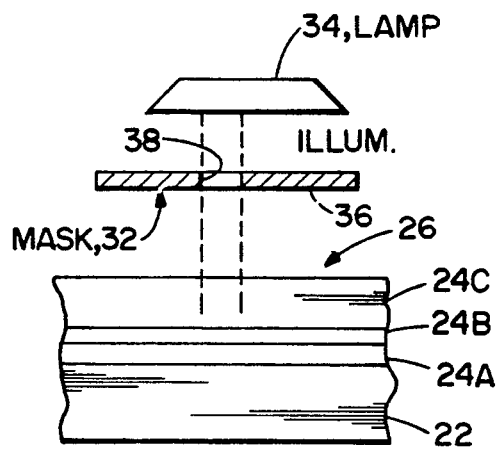
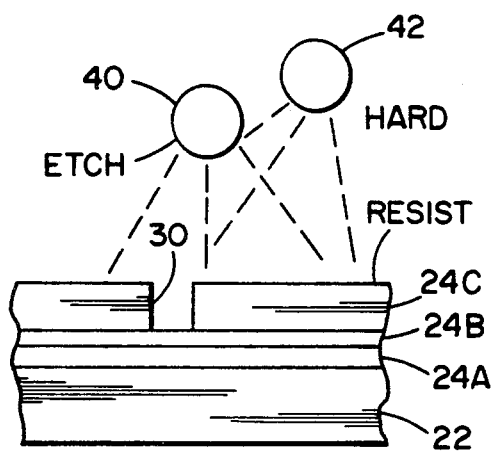
FIG. 5  FIG. 6
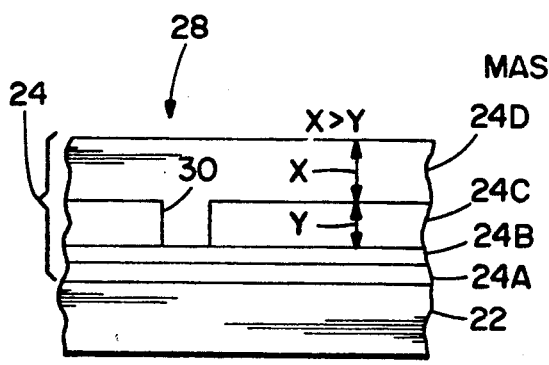
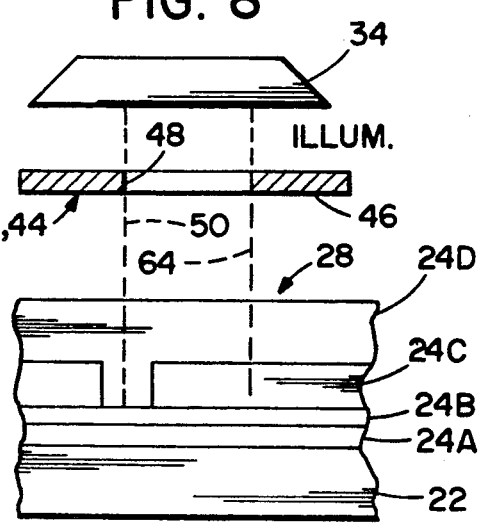
FIG. 7  FIG. 8

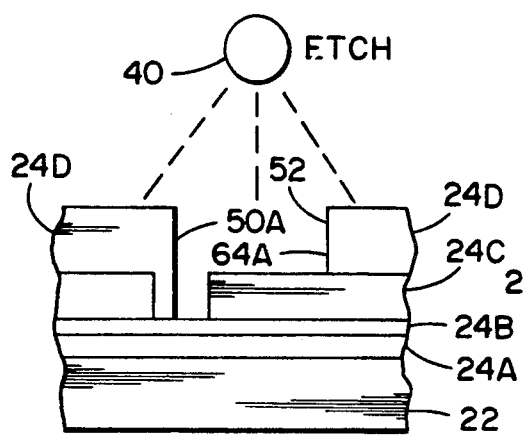
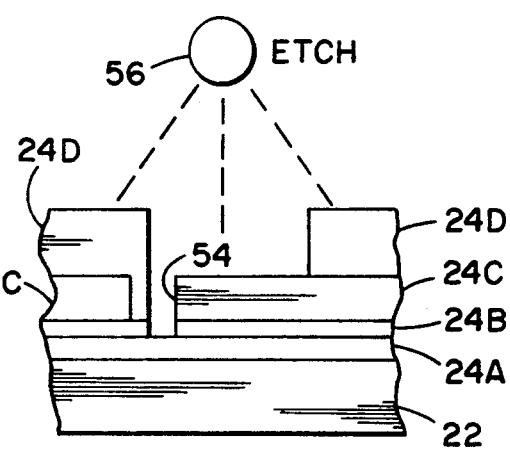
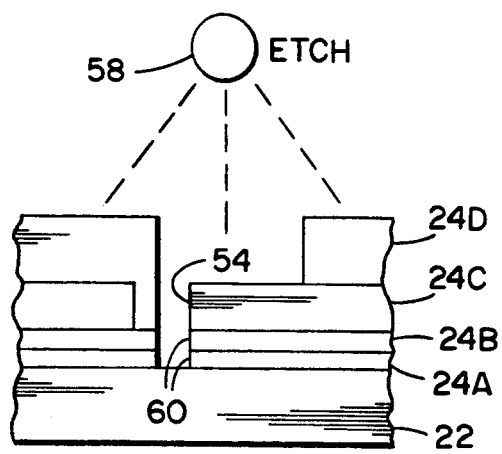
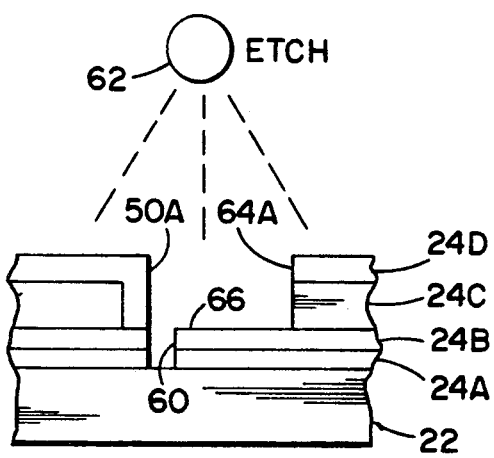
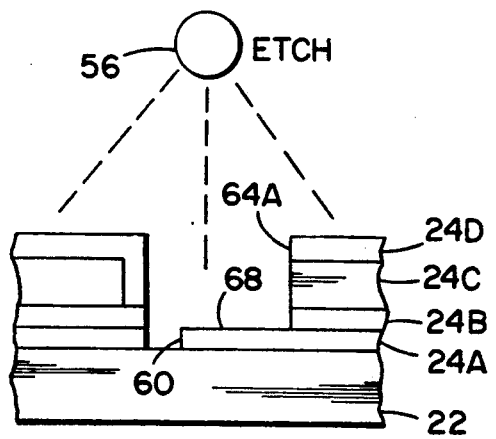
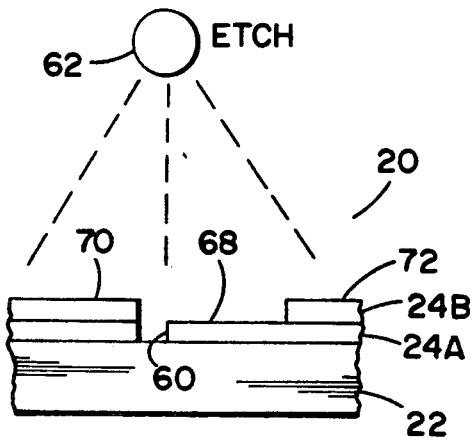

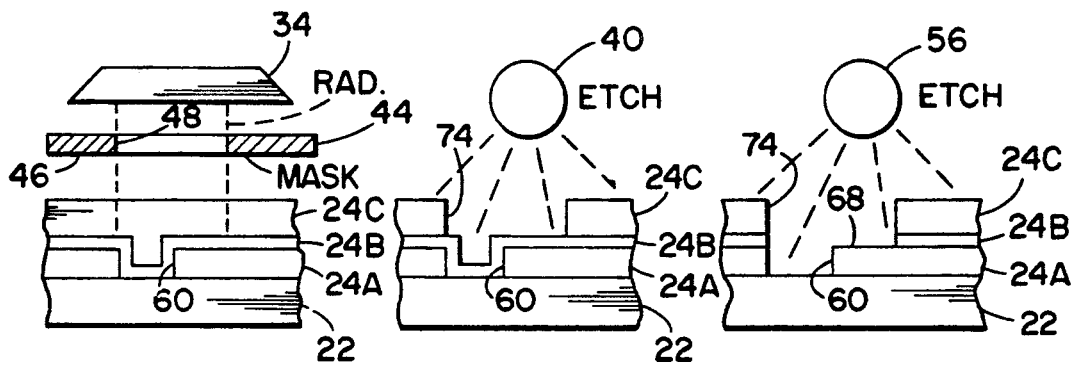
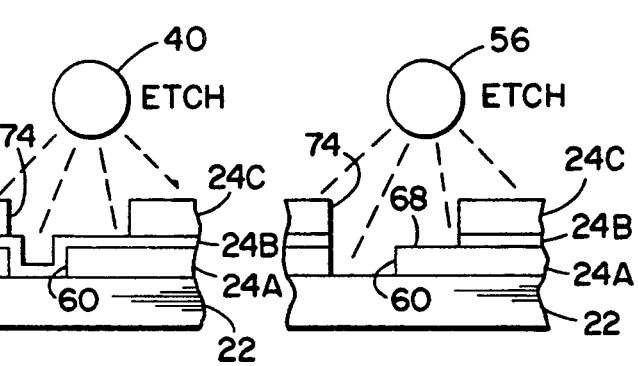
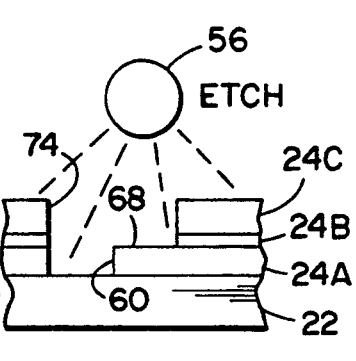
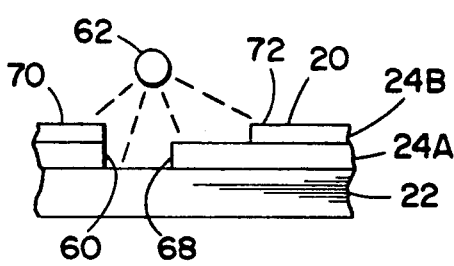
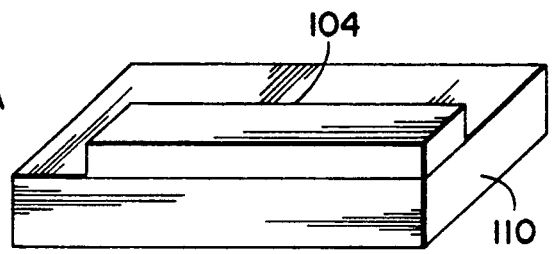
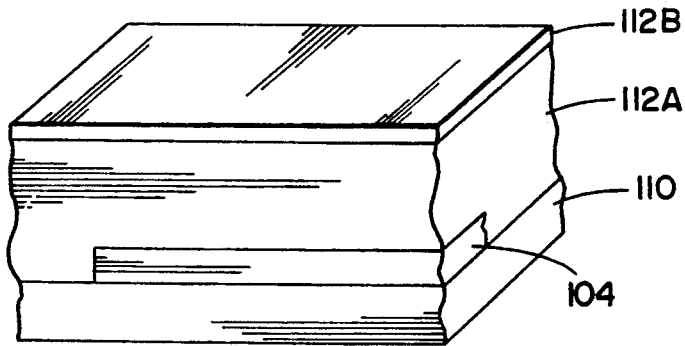
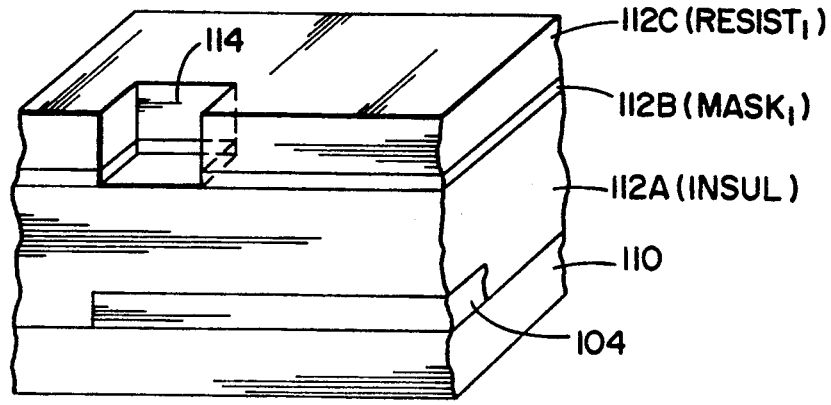

PLURAL LEVEL CHIP MASKING

RELATED APPLICATION

This application is a continuation-in-part of pending application Ser. No. 07/605,606 filed Oct. 30, 1990.

BACKGROUND OF THE INVENTION

This invention relates to the formation of masks useful in photolithography for the fabrication of semiconductor devices, and more particularly, to a construction of multiple-layer solid-state wafer by a development of masks on a wafer structure, during construction of the wafer, to allow for a succession of photolithographic steps including deposition of various materials to be performed sequentially at a work station followed by a succession of etching steps to be performed sequentially at a separate work station, thereby to reduce the number of times that a wafer need be transferred between work stations.

In the use of photolithography for the construction of semiconductor devices as well as other devices such as masks and reticles, the construction process involves numerous steps which include the exposure of photoresist through a mask to delineate specifically shaped areas which are to be etched. There are situations in which a plurality of exposure steps are to be performed sequentially with a plurality of masks to accomplish differing amounts of exposure of the various areas to be etched.

The manufacturing process can be simplified by reduction of the number of exposure steps by use of a gray level mask. A gray level mask allows a defining of two or more conventional mask levels in a single exposure step, and may be configured of various thickness of blocking materials for protection of underlying layers from various etchants used in a manufacturing process. This technique lends itself to process clustering with its potential for low defect density, and also facilitates manufacture by reducing the number of masking levels required. The technique also reduces tolerances which need be employed with various masking patterns. By way of example, an important use of gray level mask technology is for recessed multilevel wiring applications where via and interconnect wiring patterns may be produced by a reduced number of manufacturing steps.

One area of interest in the fabrication of gray-level masks is in the use of a layer of glass which has been fabricated to provide a desired level of opacity to the illuminating radiation of a photolithographic step employed in the manufacture of a semiconductor chip circuit. Fabrication of a layer of a glass material can be accomplished in accordance with the teaching of three United States Patents to Wu, namely, U.S. Pat. Nos. 4,894,303; 4,670,366; and 4,567,104 wherein there is an exchange of silver ion with the metal ions of alkali metal silicates and oxides employed in the glass to provide a desired amount of light transmissivity.

A problem arises with presently available gray level masks in that the masks are difficult to fabricate and, furthermore, produce inadequate image quality in many applications. By way of example in the fabrication of a gray level mask, it has been the practice to form the mask by an array of spaced-apart chromium islands in the nature of a half-tone screen wherein each chromium island is opaque to ultraviolet radiation while spaces between the islands allow passage of the radiation. The half-tone screen is constructed by use of electron-bream lithography so as to produce spaces between the islands wherein the spaces have dimensions smaller than a wavelength of the optical radiation. The islands may also have dimensions smaller than the wavelength of the optical radiation. As a result, there is a significant attenuation of the optical radiation transmitted through the mask. The resulting transmissivity of the mask is significantly more than that of a totally opaque mask region and significantly less than that of a totally transparent mask region. Thus, the resulting mask is a gray level mask, but a mask which produces a lower quality image than is desired. The amount of transmissivity is defined by the dimensions of the chromium islands and the spaces.

A further disadvantage of the foregoing gray level mask is the fact that images formed in the gray areas have sloped sidewalls which are unacceptable for use in producing semiconductor products requiring the higher resolution for condensed packaging of circuit elements as are being contemplated for the near future. With respect to other techniques which have been employed in the fabrication of gray level masks, there has been the disadvantage that the other fabrication methods require precise electron-beam dose control to make optical masks or electron-beam proximity correction, and produce gray layers of specific opacity.

SUMMARY OF THE INVENTION

The aforementioned problem is overcome and other advantages are provided by a construction of gray level mask which, in accordance with the invention, employs materials having differing opacity to visible light. The term "light" as used herein is understood to include those portions of the spectrum, such as visible, ultraviolet light and x-ray which are used in photolithographic processes for construction of electric circuits in semiconductor chips. Furthermore, the materials are selected in combination with specific etching agents which differentially attack a specific one of the materials without attacking the other materials. This permits the mask to be produced by conventional means of photolithography wherein regions of the various materials can be deposited in selected regions of the mask, as well as in a succession of layers superposed on each other.

The invention is advantageous because the fabrication of the gray level mask can be accomplished by use of optical, x-ray, or electron beam lithography techniques to produce a desired pattern of regions of various opacity upon the mask. It is understood that the principles of the invention can be employed in the fabrication of other structures similar to a mask, such as a reticle.

In accordance with a further aspect of the invention, the principles of construction employed in building a gray-level mask, including the use of various layers of blocking or protective material, such as layers of photoresist, can be employed directly in the construction of a wafer comprising a plurality of chip circuits. Masking layers may be formed directly on the wafer during the manufacturing process, and may be removed from the wafer when no longer required. Layers in the mask which serve as masking layers to limit depth of penetration of radiation in photolithographic steps can serve also to limit depth of penetration of etchants in etching steps. The additional masking layers can be provided as part of the assembly of layers of the wafer in the construction of the set of chips in the wafer, and may be subsequently removed, if no longer needed in the completed chips.

There is particular interest in the use of a set of masking layers to provide an electrically conductive path comprising both a vertical section in the form of a via and a horizontal interconnect section. The invention allows both sections of the conductive path to be formed in a single metal deposition step. As a result of the use of the masking layers, the deposition and the etching steps can be clustered into sequences of photolithographic steps and sequences of etching steps and deposition steps. This enables the manufacture to be simplified by a reduction in the number of transfers of a wafer between work stations, such as between a photolithographic and work station, and a material deposition work station.

A further advantage is a reduction of the tolerances which need be maintained between the mask overlays of a succession of masking steps in the case of the construction of the conductive path of a vertical via and horizontal interconnect. Photolithography and etching are employed to produce the vertical hole for the metal stud of the via and the horizontal trough for the interconnect. The trough is formed by extension over the via hole. Therefore, the size of the via hole image can be larger in the transverse direction of the trough, and tight tolerances in terms of the size of the via image need be maintained only in a direction longitudinal to the trough. The intersection of the via and trough images provides a self aligned contact via site in the subsequently etched substrate. This facilitates the manufacturing process and also permits a decrease in the exposure time in the photolithographic step of designating the hole cross-sectional shape.

BRIEF DESCRIPTION OF THE DRAWING

The aforementioned aspects and other features of the invention are explained in the following description, taken in connection with the accompanying drawing wherein:

FIGS. 1-14 show a succession of steps in the fabrication of a mask in accordance with the invention, the steps being indicated diagrammatically;

FIGS. 19-31 show a succession of steps in the fabrication of a mask in accordance with an alternative fabrication process of the invention, the steps being indicated diagrammatically;

FIGS. 32-37 show diagrammatically a succession of steps in the fabrication of a portion of a chip demonstrating the construction of an electrically conductive path including a vertical via and a horizontal interconnect wherein the via extends from the horizontal interconnect to a further metallic element, this construction including masking layers in accordance with a first embodiment of a method of the invention for construction of the electrically conductive path;

DETAILED DESCRIPTION

In the ensuing description, the principles of the invention will be demonstrated first with respect to the construction of a gray-level mask with respect to FIGS. 1-31 and, thereafter, with reference to the remaining figures, the principles of the invention will be described with respect to the development of masking layers directly in a chip, or in a wafer comprising a multiplicity of chips, to facilitate the manufacture of the chips.

Figure 15:
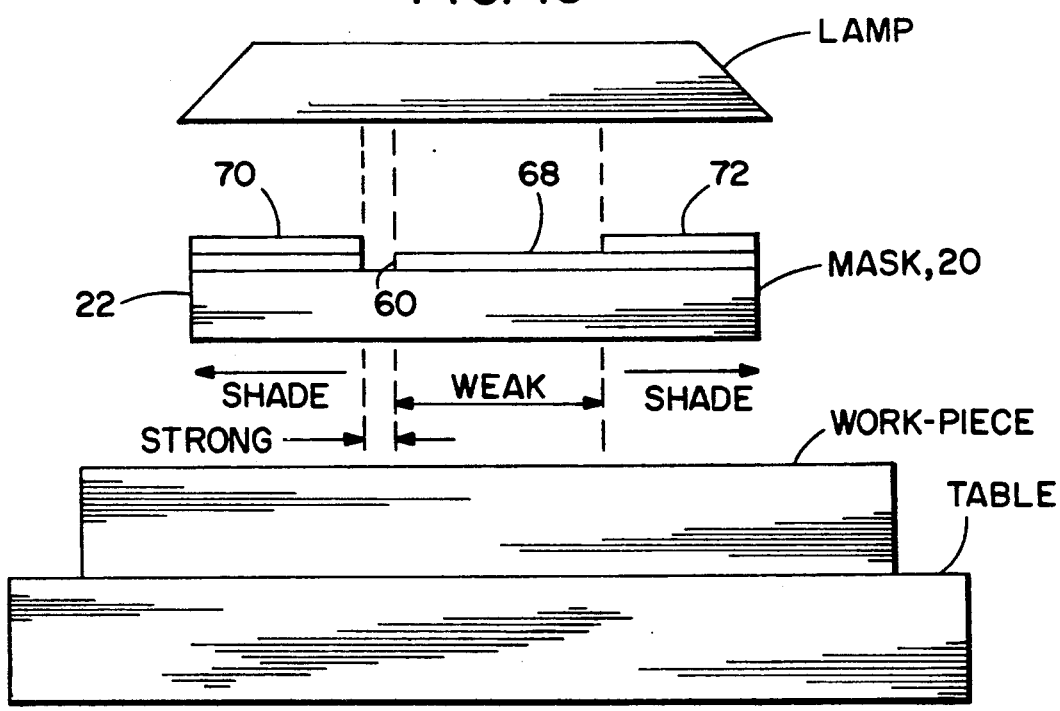
FIG. 15 shows, diagrammatically, a photolithographic system employing the mask as a reticle in the practice of the invention.

The procedure for fabrication of a gray level mask 20, shown in completed form in FIGS. 14 and 15, is accomplished in accordance with the invention, as shown in FIGS. 1-14. The procedure begins with a substrate 22 (FIG. 1) upon which is deposited a succession of three layers of material, namely, a first layer 24A, a second layer 24B, and a third layer 24C to provide a structure 26 (FIG. 4). A further layer 24D is subsequently deposited to provide a further structure 28 (FIG. 7). In the structure 28, the substrate 22 supports a set of four layers 24. The third layer 24C has an opening 30 filled with material of the fourth layer 24D. In the ensuing description, the legend 24 may be employed to identify the layers generally, with the suffixes A-D being employed to identify specific ones of the layers. The structures 26 and 28 are employed with various lithographic steps (FIGS. 5 and 8) and etching steps (FIGS. 6 and 9-14) to produce the completed mask 20.

The fabrication procedure is described now in greater detail. With reference to FIG. 1, the substrate 22 is constructed, typically, of a transparent material, such as glass, which is suitable for use in lithographic procedures employed in various manufacturing processes such as the fabrication of semiconductor devices, masks and reticles, by way of example, wherein the mask 20 may be used to advantage. In FIG. 2, the first layer 24A is deposited upon the top surface of the substrate 22.

The first layer 24A is fabricated of a material which has greater opacity and reduced transmissivity to the propagation of radiation such as light than does the material of the substrate 22. A similar mask structure built with different materials may be suitable for x-radiation. Preferably, the material of the first layer 24A comprises a glass which has been doped with an optical transmission inhibitor such as a coloring agent or a darkening agent which inhibits the propagation of light so as to reduce the optical transmissivity of the first layer 24A to a fraction of the transmissivity of the substrate 22, while still permitting a significant amount of light to propagate through the first layer 24A. By way of example, the optical transmissivity of the second layer 24A may have a value lying in a range of $\frac{1}{4}-\frac{7}{8}$ the optical transmissivity of the substrate 22.

It has been found useful, in accordance with a preferred embodiment of the invention, to fabricate the first layer 24A of a glass material constructed in accordance with the teaching of three United States Patents to Wu, namely, U.S. Pat. Nos. 4,894,303; 4,670,366; and 4,567,104. In the Wu patents, there is an exchange of silver ion with the metal ions of alkali metal silicates and oxides employed in the glass. Characteristics of the base glass composition, particularly the light transmissivity, can be varied by photoreduction of silver ions. A useful feature of the glass is the fact that the amount of light transmissivity can be adjusted by exposure to an electron beam for darkening the glass, and by exposure to heat above approximately 200 degrees Celsius for recovering transparency. The first layer 24A may be referred to as a filter glass. The capacity for darkening by use of the electron-beam radiation, and the capacity for regaining transparency by heating with a laser are indicated in simple fashion diagrammatically in FIG. 2, and are explained in further detail subsequently with reference to FIGS. 16–18.

In FIG. 3, the second layer 24B is deposited on the top surface of the first layer 24A. The deposition of both of the layers 24A and 24B are accomplished in accordance with well-known practice in the manufacture of multiple-layered semiconductor devices. The optical transmissivity of the material of the second layer 24B is less than that of the first layer 24A. By way of example, the optical transmissivity of the second layer 24B has a value lying in a range of $\frac{1}{2}$ the optical transmissivity of the substrate 22 to zero transmissivity, a zero transmissivity being obtained by making the second layer 24B opaque. By way of example in the construction of the mask 20, the preferred embodiment of the mask 20 has been fabricated by constructing the second layer 24B of an opaque material, namely, a layer of metal, preferably chromium. The respective thicknesses of the layers 24A and 24B are selected as a matter of convenience in the process of manufacturing the mask 20, a suitable range of thickness for each of the layers 24A and 24B being the range of approximately 0.05 micron to $\frac{1}{2}$ millimeter.

In FIG. 4, the third layer 24C is deposited upon the top surface of the second layer 24B. The layer 24C comprises resist material, such as photoresist which is deposited by use of conventional techniques well-known in the manufacture of semiconductor devices. The layer 24C may be referred to as Resist 1. The step in FIG. 4 is the first of a sequence of steps for providing a resist structure comprising a plurality of layers of resist material. A second resist layer of the resist structure is shown as a fourth layer 24D in FIG. 7. A feature in the construction of the resist structure is the configuring of the third layer 24C to provide the opening 30 prior to deposit of the fourth layer 24D.

FIGS. 5 and 6 show, respectively, photolithography and etching steps employed in configuring the layer 24C to provide the opening 30. FIG. 6 also shows a step of hardening the photoresist material of the third layer 24C subsequent to the etching process. In FIG. 5, the photolithography employs a mask 32 and a source of radiation such as light or electron-beam or x-radiation represented by a lamp 34, the mask 32 having an opaque region 36 and a transparent, or open, region 38. The lamp 34 and the mask 32 are arranged above the structure 26 with the mask 32 being disposed between the lamp 34 and the third layer 24C. Light from the lamp 34 is directed toward the mask 32 with rays of the light propagating through the transparent region 38 to impinge upon a layer 24C of the photoresist. The illuminated region of the photoresist of the layer 24C is activated by the light to respond to a subsequent step of etching (FIG. 6). In accordance with well-known practices in the manufacture of semiconductor devices, etching may be done with a developer such as potassium hydroxide which etches away the illuminated portion of the photoresist material to form an opening 30 in the layer 24C. The etchant is divided, by way of example, by an etchant source 40 depicted as a device for delivering etchant as by spraying the etchant on the layer 24C. Subsequent to the etching step, a source 42 of ultraviolet radiation is employed to radiate the layer 24C so as to harden the material of the layer 24C, the term hardening being used to indicate that the resist material is no longer sensitive to illumination by light of the lamp 34. The hardening step may or may not be required depending on the formulation of the photoresist and subsequent etches. The foregoing description relates to a positive photoresist, it being understood that the practice of the invention includes a mask made by a negative resist.

In FIG. 7, fabrication of the resist structure continues with deposition of the fourth layer 24D, this being a layer of photoresist as has been noted above. The fourth layer 24D may be referred to as Resist 2. The depth, x, of the fourth layer 24D is shown greater than the depth, y, of the third layer 24C for purposes of illustrating the invention, it being understood, also, that x may be equal to or less than y if desired.

In FIG. 8, the lamp 34 and a mask 44 are arranged above the structure 28 with the mask 44 disposed between the lamp 34 and the fourth layer 24D. The mask 44 is aligned to the structure 28, and has an opaque region 46 and a transparent, or open, region 48. The lamp 34 directs light towards a mask 44 with rays of the light propagating through the transparent region 48. The rays of light from the lamp 34 penetrate both the fourth layer 24D and the third layer 24C. Resist material of the fourth layer 24D is activated by the light to be responsive to an etchant of a subsequent etchant step depicted in FIG. 9. However, the resist material of the third layer 24C has been hardened (FIG. 6) and, as noted above, has been rendered insensitive to illumination by the light of the lamp 34. Therefore, in the subsequent etching step of FIG. 9, only the resist material of the layer 24D will be affected by the etchant, and the configuration of the layer 24C including the configuration of the opening 30 will remain unchanged in the subsequent etching step of FIG. 9.

In FIG. 9, the etchant source 40 is employed again to remove photoresist from the region illuminated in FIG. 8. By way of example in the use of the photolithographic step of FIG. 8 and the etching step of FIG. 9, a boundary 50 (FIG. 8) of the illuminated region, and a resulting edge 50A (FIG. 9) of a recess 52 produced by the etching of FIG. 9 intersect the opening 30 (FIG. 8) resulting in a smaller opening 54 (FIG. 9) which extends from the recess 52.

In FIGS. 10 and 11, the opening 54 is extended in length by etching away a part of the second layer 24B (FIG. 10) and a corresponding part of the first layer 24A (FIG. 11). In accordance with a feature of the invention, in FIG. 10, by use of an etchant source 56, the etching of the material (chromium) of the second layer 24B is accomplished by use of an etchant which selectively etches the material of the layer 24B without having any significant etching effect on the materials of the other layers 24. Thus, in FIG. 10, the chromium of layer 24B may be etched by use of liquid ceric ammonium nitrate in nitric acid, or by use of a dry ion plasma etch employing chloride ions in the plasma. For example, the plasma etch by the source 56 may be accomplished in a vacuum employing an electric field, with the vacuum chamber employing argon, and carbon tetrachloride as a source of these ions.

Subsequently, in FIG. 11, the source 58 provides an etchant suitable for the selective etching of the material (glass) of the first layer 24A, the etchant of FIG. 11 having essentially no effect upon the material of other ones of the layers 24. In a preferred embodiment of the invention, the preferred etchant in the etching step of FIG. 11 is a dry plasma etch, a reactive ion etch (RIE) of $CHF_3 + O_2$ which is well suited for producing a narrow trough, or a narrow diameter hole such as the extension of the opening 54. By way of example in the use of the completed mask, the hole may be used to form a via connection with a conductor shape formed in the trough in a subsequent metallization procedure. Alternatively, a wet etch of buffered hydrofluoric acid may be employed. Other etches which may be employed for etching the material of the first layer 24A do not have as great a selectivity in the etching because they tend to attack also the materials of the layers 24, and make dimensional control more difficult. Such etches are nitrogen trifluoride plus argon, and also carbon tetrafluoride plus oxygen.

The foregoing selection of materials to be used in the various layers 24, as well as etches which can selectively etch the materials of individual ones of the layers 24 demonstrates an important aspect of the invention which allows the mask 20 to be constructed by use of photolithographic and etching steps. As shown in the foregoing steps, the invention has provided also for the extension of the opening 54 by a depression 60 into the first two layers 24A and 24B. It is also noted that by locating the boundary 50 (FIG. 8) of the light beam within the opening 30 and the resultant production of the edge 50A (FIG. 9) it has been possible by back-filling the opening 30 (FIG. 7) with material of the fourth layer 24D to create the opening 54 and the depression 60 with a cross-sectional dimension which is smaller than that of the opening 30.

In FIG. 12, a source 62 of etchant is employed to remove the portion of the third layer 24C lying between the boundary 50 and a boundary 64 (FIG. 8) of the light beam defined by the transparent region 48 of the mask 44. In the etching step of FIG. 9, an edge 64A of the recess 52 is produced at the location of the boundary 64 of the light beam. The edge 64A is extended through the third layer 24C up to the top surface of the second layer 24B by the etching process of FIG. 12. The etching in FIG. 12 is accomplished by RIE with oxygen in an optional environment of argon. It is noted that the etching of FIG. 12 attacks both the unhardened layer 24D and the hardened layer 24C without attacking the first two layers 24A (glass) and 24B (chromium). This is in accordance with the above noted aspect of the invention in which etches are selected to provide for selected etching in accordance with the selection of materials of the various layers 24.

The etchant of FIG. 12 attacks the resist in both of the layers 24D and 24C. However, since the layer 24D was prepared with a thickness greater than that of the layer 24C, some of the layer 24D remains in the structure of FIG. 12 to provide increased protection of the layer 24B during the etching step of FIG. 13. If the layer 24D were prepared with a thickness less than that of the layer 24C, then, in FIG. 12, none of the material in the horizontal portions of the layer 24D would appear, and the layer 24C would appear reduced in thickness.

FIGS. 12–14 show the final steps in the fabrication of the mask 20. The etching of FIG. 12 has exposed a portion 66 of the second layer 24B lying between the depression 60 and the edge 64A. Exposure of the portion 66 in FIG. 12 prepares the portion 66 for a further etching shown in FIG. 13. FIG. 13, the etching step is performed by use of the source 56, previously disclosed in FIG. 10, for etching the chromium of the second layer 24B. This produces the structure shown in FIG. 13. The etching away of the portion 66 of the second layer 24B exposes a corresponding portion 68 (FIG. 13) of the first layer 24 A. The portion 68 extends from the depression 60 to the edge 64A. Finally, in FIG. 14, there is a further etching step utilizing the source 62, previously described in reference to FIG. 12, in which the remaining portions of the material in each of the layers 24C and 24D are removed, by example, with $O_2$ RIE.

FIG. 14 shows the resulting mask 20 which is constructed to provide for differing transmissivities of light. The regions of the mask 20 having portions of the second layer 24B are opaque to light. The exposed portion 68 of the first layer 24A is partially transmissive to light. In the depression 60, both of the layers 24A and 24B are absent so as to permit full transmission of light through the transparent substrate 22. Thereby, the mask 20 attains the gray scale function by providing full transmission of light at the site of the depression 60, partial transmission of light at the exposed portion 68 of the first layer 24A, and zero transmission of light at the remaining portions 70 and 72 of the opaque layer 24B.

FIG. 15 shows diagrammatically a lithographic system employing the mask 20 in conjunction with a lamp and a table for holding a workpiece. The table positions the workpiece in front of the lamp, and the mask 20 is positioned between the lamp and the workpiece for illuminating the workpiece with a pattern of light established by the mask 20. The pattern of light includes shaded regions produced by the portions 70 and 72, a strongly illuminated region at the depression 60 and a weakly illuminated region at the portion 68. Thereby, the mask 20 can be employed in a lithographic process for providing differing levels of illumination.

In the practice of the invention, additional layers of partially transmissive material may be employed in the construction of a mask, such as the mask 20, to provide multiple layers of gray level illumination.

In accordance with a further feature of the invention, the glass filter of the first layer 24A has an opacity produced by the presence of the substituted silver ions (as described in the aforementioned patents of Wu). As has been described above, the opacity can be increased by exposing the first layer 24A to radiation of an electron beam, and can be reduced by a heating of the first layer 24A by exposure to a laser beam. An increase in the opacity produces a decrease in the optical transmissivity of the glass of the layer 24A, and vice-versa. Advantage may be taken of this characteristic of the glass filter in the fabrication of the mask, as is disclosed in FIG. 2 wherein, subsequent to the step of depositing the first layer 24A, but prior to the step of depositing the second layer 24B, the layer 24A may be radiated with an electron beam for reacting with the silver to increase the opacity, or by radiating with a laser to heat the layer 24A to reverse the reaction of the silver so as to regain the optical, or light, transmissivity. These additional fabrication steps, as indicated in simplified form in FIG. 2, provide greater versatility in the fabrication of the mask 20 so as to allow customizing of the mask 20 for use in specific manufacturing processes, such as the manufacture of a specific semiconductor device.

Figure 16:
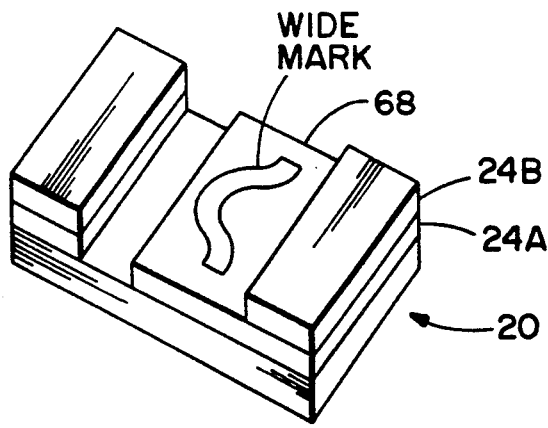
FIGS. 16-18 disclose in stylized perspective view an adjustment of optical transmissivity in a glass film layer of a completed mask by use of a laser heating beam and an electron writing beam for reconfiguring a relatively opaque mark on the glass film.
Figure 17:
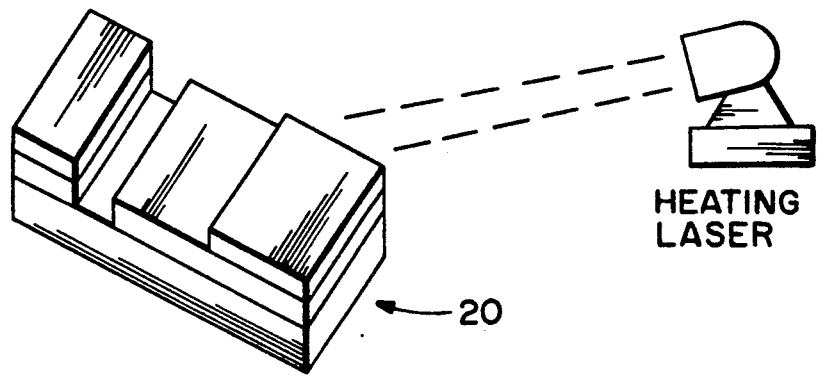
Figure 18:
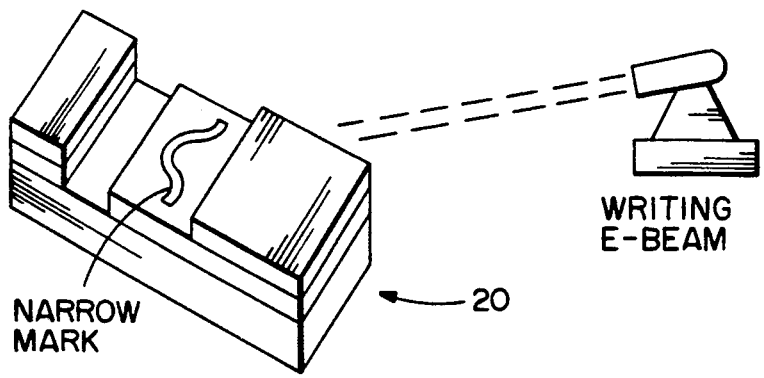

With reference also to FIGS. 16-18, if desired, the electron beam can be directed to specific regions of the first layer 24A by use of a well-known mask or beam-deflection electronics to produce differing levels of opacity at different locations of the glass filter of the first layer 24A. FIG. 16 shows a situation wherein the layer 24A of a completed mask 20 is provided with a relatively opaque mark located within a surrounding region of greater opacity. By way of example, the mark is portrayed as an elongated arcuate mark having a width greater than is desired for a specific manufacturing application in which the mask 20 is to be employed. It is desired to reduce the width of the mark. This is accomplished by irradiating the portion 68 of the glass filter layer 24A with a laser beam (FIG. 17) to heat the glass material, and reduce the opacity of the mark to that of the surrounding region. Then, as shown in FIG. 18, electron-beam apparatus provides a beam, considerably narrower than the laser beam and having a shorter wavelength than the laser beam, for writing a new mark of desired width upon the exposed portion 68 of the layer 24A. The electron beam reacts with the glass material to decrease light transmissivity in the locations illuminated by the electron beam and, thereby generate the mark with the desired reduction in width.

FIGS. 19-31 show a sequence of steps of a process for the manufacture of the mask 20, this process being an alternative to the process disclosed in FIGS. 1-14. There are similarities between the two processes. FIGS. 27-30 show three layers 24A, 24B and 24C which are composed of the same materials and have the same thicknesses as do the layers 24A, 24B and 24C of FIGS. 4-13. Also, in both processes, the foregoing layers are supported upon the substrate 22. The etchant sources 40, 56, 58 and 62 are employed also in the alternate process of FIGS. 19-31, and function in the same manner as has been described with reference to the process of FIGS. 1-14. In addition, the lamp 34 and the masks 32 and 44 are employed in the alternate process of FIGS. 19-31, and function in the same manner as has been described with reference to the process of FIGS. 1-14.

Figure 19:
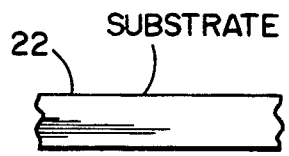
Figure 20:
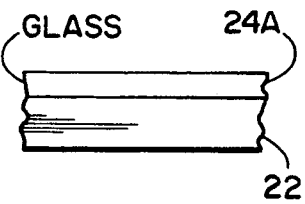
Figure 21:
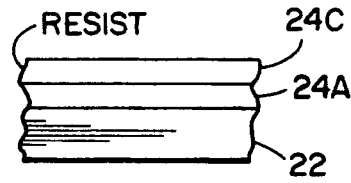
Figure 22:
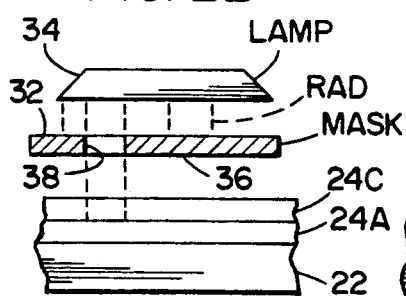

The alternate process for fabrication of the mask 20 begins with preparation of the substrate 22 in FIG. 19. Thereupon, the glass layer 24A is deposited upon the top surface of the substrate 22 in FIG. 20, this being followed by a deposition of the resist layer 24C upon the top surface of the glass layer 24A in FIG. 21. In FIG. 22, the mask 32 and the lamp 34 are employed to illuminate the resist layer 24C with radiation to expose predetermined regions of the resist layer 24C in correspondence with the image of the mask 32, one such exposed region being shown in FIG. 22 beneath a transparent region 38 of the mask 32.

Figure 23:
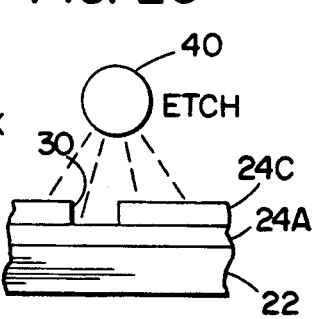
Figure 24:
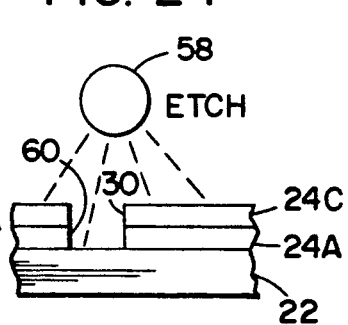
Figure 25:
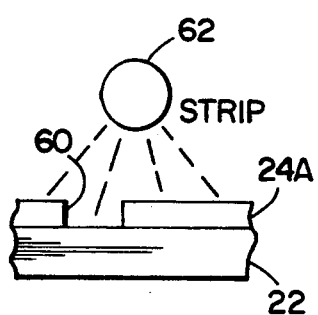

The process continues with three etching steps disclosed in FIGS. 23-25. In FIG. 23, the etchant of the source 40 removes the portion of the resist layer 24C which has been exposed to the radiation in FIG. 22, the removal of the portion of the layer 24C producing the opening 30 and configuring the layer 24C in the form of a mask to be used in the subsequent etching steps of FIGS. 24 and 25. It is noted that, in FIG. 23, the etchant attacks only the resist layer 24C, and leaves the glass layer 24A intact. In FIG. 24, the etchant of the source 58 preferentially attacks the exposed portion of the glass layer 24A, beneath the opening 30, and leaves the resist layer 24C intact. The etchant of the source 58 removes the material of the exposed region of the glass layer 24A down to the top surface of the substrate 22 to form the depression 60 in the glass layer 24A. Upon completion of the depression 60, the remainder of the resist layer 24C is stripped away by etchant of the source 62, as shown in FIG. 25.

Figure 26:
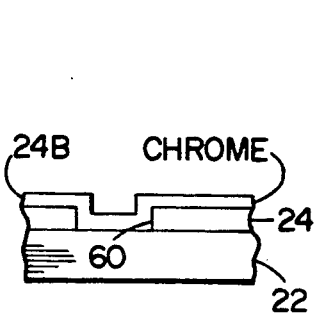
Figure 27:
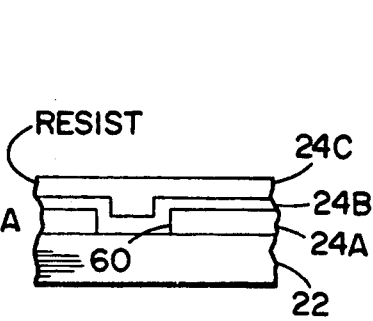

In FIG. 26, a chromium layer 24B is deposited conformably upon the top surface of the glass layer 24A and upon the exposed portion of the substrate 22 at the bottom of the depression 60. This is followed, in FIG. 27, by a deposition of a resist layer 24C upon the top surface of the chromium layer 24B. In FIG. 28, the lamp 34 and the mask 44 are employed to expose predetermined regions of the resist layer 24C with radiation of the lamp 34. The radiation propagates through transparent regions of the mask 44, one transparent region 48 being shown in FIG. 28. The exposure of the predetermined regions of the resist layer 24C by the radiation in FIG. 28 prepares the resist layer 24C for subsequent etching steps of FIGS. 29 and 30.

In FIG. 29, etchant of the source 40 attacks the regions of the resist layer 24C which have been exposed to the radiation in the step of FIG. 28, the etchant of the source 40 removing material of the resist layer 24C in the exposed regions while leaving the chromium layer 24B intact. The removal of material at the predetermined regions of the resist layer 24C leaves openings, one such opening 74 being shown in FIG. 29, which configure the resist layer 24C in the form of a mask suitable for the etching step of FIG. 30. In FIG. 30, etchant of the source 56 propagates through the opening 74 to etch preferentially the chromium of the layer 24B while leaving material of the resist layer 24C and material of the glass layer 24E and material of the substrate 22 intact. In particular, it is noted that the etching step of FIG. 30 removes chromium from the vertical and horizontal surfaces of the depression 60 of the glass layer 24A, and also exposes the portion 68 of the top surface of the glass layer 24A to produce the configuration of a step as shown in FIG. 30. Finally, at FIG. 31, the remaining portion of the resist layer 24C is stripped away to produce the completed mask 20. The stripping of the resist layer 24C in FIG. 31 is accomplished in the same fashion as has been disclosed in FIG. 25 by use of the etchant of the source 62. Thereby, the alternative process of FIGS. 19-31 has produced the mask 22 with the same configuration as has been fabricated by the process of FIGS. 1-14.

An important advantage in the sequences of steps employed in the process of FIGS. 1-14 and in the process of FIGS. 19-31 is that these sequences allow the processes to be conducted with a minimal amount of transference of a wafer or chip under construction among various work stations wherein the various steps are performed. This advantage is attained by employing various ones of the layers of materials developed during early steps of the processes to serve as masks during subsequent etching steps. Thus, not only is the end product useful as a mask for photolithography, but various layers employed in the construction also serve as masks to delimit various etchings employed in the construction process. The use of multiple layer masks for etching steps simplifies the manufacturing process by allowing sequences of steps to be clustered about about work stations having the tools for performance of the steps of a sequence, thereby to minimize the transference of the wafer back and forth among various stations. An important example in the practice of the invention is in the construction of an electrically conductive path comprising a vertical via and a transverse interconnect. In the construction of such a path, the mask employed for defining the horizontal interconnect overlies a mask defining a metal stud of the via. Thus, alignment of the masks and their configurations are readily established in the transverse direction of the trough so that tight tolerances need be maintained only in a direction longitudinal to the direction of the trough.

The concept of clustering the steps can be understood by reference to a sequence of process steps which might be performed in a manufacturing process of the prior art for the fabrication of the foregoing form of electrically conductive path. See for example U.S. Pat. No. 4,789,648 to Chow et al.

For example, such a process of the prior art might start with the deposition of metal upon an insulator in a vacuum chamber. Thereafter, photoresist is deposited upon the metal in a clean room environment. The photoresist is patterned in a photolithographic area. The metal is etched in an etching station utilizing the patterned photoresist as a mask to define the regions of etch. The photoresist would then be stripped off by plasma in the photolithographic area. Then more insulator would be deposited in an insulation deposition station. This leaves bumps in the surface of the insulator which must be removed by planarization in a planarization station. There follows further photoresist and masking by use of the photolithographic station to define the outline of the metal of a via. This is followed by further etch in an etch station to provide the via hole to be filled with metal in later step in vacuum at a metal deposition. Thereupon there is etch back of the photoresist and any extra metal at an etch station.

In the foregoing example, it is apparent that there is much transference of the workpiece from one workstation to another workstation. This represents an inconvenience to the manufacturing process and adds extra handling, unwanted complexity and loss of time in the construction of the wafer. In contrast, in the sequences of steps employed in the process of FIGS. 1–14 and in the process of FIGS. 19–31, there a minimal amount of transference of the workpiece among various work stations wherein the various steps are performed. Thus, the foregoing processes of the invention embody the feature of minimizing transference of the workpiece among the workstations.

The sequences of steps employed in the process of FIGS. 1–14 and in the process of FIGS. 19–31 demonstrate a feature of the invention employing the depression 60 and the deleted portion 68 of the chromium layer 24B shown in both FIGS. 14 and 31. As will be explained in subsequent embodiments of the invention, the depression 60 and the deleted portion 68 are employed advantageously for the construction of an electrically conductive path suitable for connecting elements of an electric circuit constructed in a chip. By way of example the electrically conductive path includes the vertical stud of a via and a horizontal interconnect. The void of the depression 60 is employed advantageously for construction of the vertical stud of the via by depositing metal in the depression 60. During the metallization of the stud, metal is also deposited in the region 68 to form the horizontal interconnect. Thus, the foregoing portions of the mask 20 can be used to define regions of metallization in the construction of a chip circuit. This use of the depression 60 and the region 68 allows the metallization to be accomplished with a minimum of transference of the workpiece among workstations, and also minimizes the constraints of alignment of the mask layers used in the delineation of the depression 60 and the region 68. There follows three embodiments of the methodology of the invention carrying forth the foregoing features of the invention.

Figure 35:
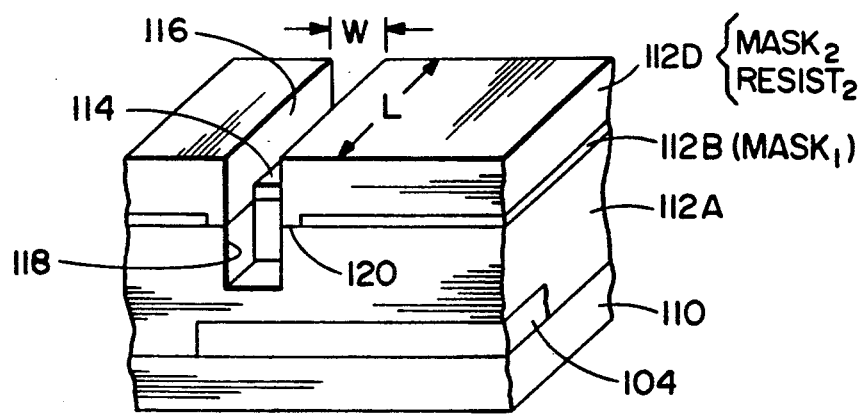
Figure 36:
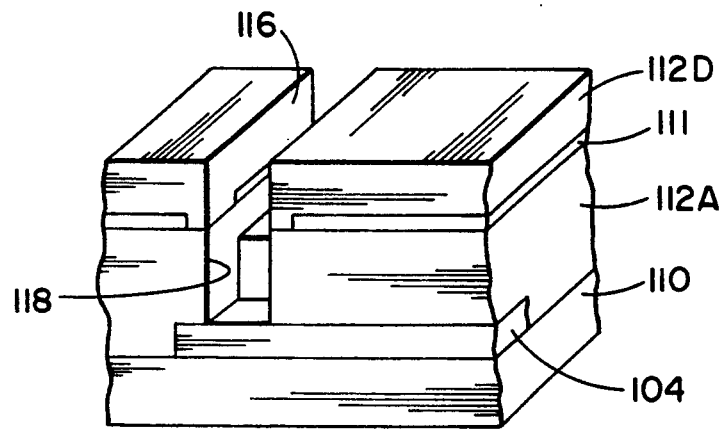
Figure 37:
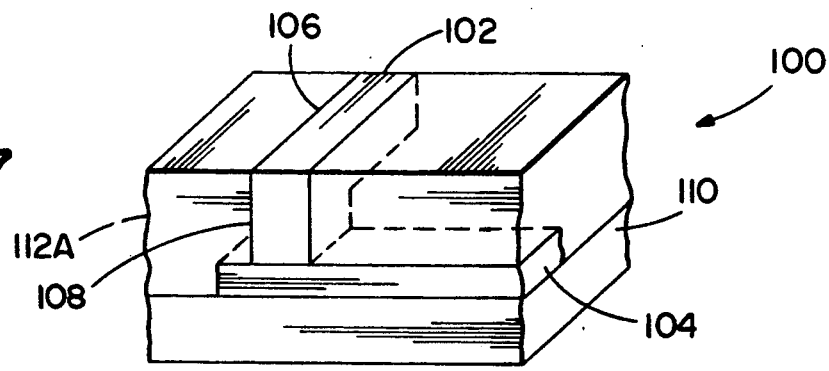

FIGS. 32–37 present a sequence of steps for construction of a wafer or chip 100, shown in fragmentary view in FIG. 37. The chip 100 comprises an electrically conductive path 102 and an electrically conductive element 104, the path 102 including a horizontal interconnect 106 and a vertical via 108, the via 108 providing electrical connection between the interconnect 106 and the element 104. The chip 100 also includes a substrate 110 which supports the foregoing components of the chip, and an insulator layer 112A which rests upon the substrate 110 and encloses the electrically conductive element 104 and the electrically conductive path 102. By way of example in the construction of the chip 100, the substrate 110 may be fabricated of an electrically insulating material such as silicon dioxide and the insulator layer 112A may be constructed also of silicon dioxide. The element 104 is constructed typically of a metal such as aluminum or tungsten, and may also be fabricated of a non-metallic conductive material such as polysilicon if desired. Also, the via 108 and the interconnect 106 are constructed preferably of a metal such as aluminum or tungsten, or a non-metallic conductive material such as polysilicon.

The procedure for construction of the chip 100 begins in FIG. 32 in which the element 104 is deposited upon the substrate 110 with the specific form of the element 104 being delineated by masking and etching steps including the use of photoresist as has been described hereinabove with reference to the patterning of the chromium in the chromium layer 24B at FIG. 10.

The procedure continues at FIG. 33 with the deposition of the material of the insulator layer 112A upon the substrate 110 and upon the element 104. A typical depth of the layer 112A is approximately 1.5 microns. To facilitate the description, the interface between the layer 112A and the substrate 110 may be regarded as the bottom surface of the layer 112A, the opposite surface being designated as the top surface. Following the deposition of the material of the layer 112A, there is a step of planarizing the top surface of the layer 112A to remove any undulations associated with the presence of the element 104. Planarization may be conducted in conventional fashion by use of photoresist-RIE-etch back or chemical mechanical polish of the top surface of the layer 112A. During the planarizing step, the thickness of the layer 112A is reduced to approximately 1.3 microns by way of example. This is followed by deposition of a further layer 112B upon the top surface of the layer 112A. The layer 112B is formed of a material, which has the property of selective resistance to an etch so as to be suitable for use as an etch-stop layer. By way of example, a suitable material is aluminum oxide, or silicon nitride, silicon or a metal. The layer 112B has a thickness typically of 0.2 microns.

In FIG. 34, the layer 112B is converted to a first mask. This is accomplished by depositing a first layer 112C of photoresist upon the layer 112B. A void 114 is created in the layers 112C and 112B, the void 114 extending through the layers 112C and 112B down to the top surface of the layer 112A. The void 114 is constructed by masking and etching steps such as those disclosed in FIGS. 5 and 6 for creating the opening 30 in the photoresist layer 24C. Extension of the void 114 through the layer 112B (FIG. 34) is accomplished by a further etch step such as used in describing in FIG. 10. This produces the desired shape or pattern to the layer 112B as shown in FIG. 34. By way of example, in the event that the layer 112B is fabricated of a metal, the etchant source 56 of FIG. 10 may be employed for reactive ion etching (RIE) for a dry plasma etch of chloride ions, or a suitable liquid etch. The portion of the void 114 in the layer 112C is obtained by removing light-exposed area of the photoresist by use of developer.

In FIG. 35, the procedure continues by stripping off the first layer 112C of the photoresist, and replacing this layer with a second layer 112D of photoresist. Thereupon, by masking and use of developer, the layer 112D is etched down to the layer 112B to form a horizontal trough 116 at the location of the void 114, the material of the layer 112D extends down to the insulator layer 112A and, accordingly, during the formation of the trough 116, the photoresist of the layer 112D is removed down to the top surface of the layer 112A. Upon constructing the trough 116 within the layer 112D, the layer 112D takes the form of a second etch mask which trims the size of the via 114 in layer 112B. A further RIE employing $CHF_3+O_2$ produces an opening 118 within the insulator layer 112A, the etching of the opening 118 extending downward approximately 0.6 microns into the insulator layer 112A. This produces the structure shown in FIG. 35.

A feature of the invention can be noted from FIG. 35. The void 114 may have a circular or elliptical shape, which shape is a part of the first mask in the layer 112B. A cross-sectional dimension, or diameter, of the void 114 in a direction transverse to the trough 116 is preferably greater than the width of the trough 116. This is shown in FIG. 35 wherein a part of the photoresist of the layer 112D extends into side regions of the void 114, such as at the side region 120. The width of the trough 116 is designated by W and the length of the trough 116 is designated by L in FIG. 35. Reduction of the opening 118 is accomplished by use of both the first mask and the second mask. The second mask delimits a width of the opening 118 to be equal to the width W of the trough 116. The first mask delimits the orthogonal cross sectional dimension of the opening 118 by the void 114. It is noted that both of the masks are produced by photolithographic processes and, as is well known, the masks used in photolithography need be aligned with each other. However, there are limits on the tolerance with which masks can be aligned. Accordingly, the oversizing of the transverse dimension of the void 114, in the direction transverse to the trough 116, allows for some misalignment among the masks of the photolithography processes so that, even if the second mask of the layer 112D is not centered along an axis of the void 114, an adequate opening 118 can still be created. With respect to misalignment of the masks of the layers 112B, and 112D in the longitudinal direction of the trough 116, the trough 116 extends for a sufficient distance beyond the void 114 to insure an adequate area of intersection of the trough 116 with the void 114. Thereupon, an adequate opening 118 is created even in the presence of misalignment between the two masks of the layers 112B and 112D in either the longitudinal or the transverse directions of the trough 116.

In FIG. 36, the procedure continues with an etching of the region of the layer 112B disposed along the bottom of the trough 116 in FIG. 35. The same etchant is employed as was employed in the creation of the void 114 in the layer 112B. This exposes the top surface of the insulator layer 112A in the region of the trough 116. Thereupon, in FIG. 36, the etching for creation of the opening 118 is resumed to extend the opening 118 down to the electrically conductive element 104, this being a further etching of approximately 0.3 microns. Since the insulator layer 112A is exposed to the etchant throughout the length of the trough 116, the bottom of the trough 116 is etched to a greater depth, namely, the aforementioned 0.3 microns. During this etching step, the second mask of layer 112D serves to define the pattern which is etched in the insulator layer 112A. There results the structure shown shown in FIG. 36.

In FIG. 37, the photoresist of the layer 112D has been stripped off by use of plasma or RIE with oxygen. The opening 118 and the trough 116 are then filled, with an electrically-conductive material, preferably, a metal such as that employed in the construction of the element 104. For example, in the event that the element 104 is constructed of aluminum, then the opening 118 and the trough 116 are filled with aluminum by chemical vapor deposition (CVD). Thereupon, the metal in the trough 116 is planarized down to the top surface of the insulator layer 112A, the planarizing removing the material of the layer 112B. This produces the structure of the portion of the chip 100 shown in FIG. 37. The portion of the metal deposited within the opening 118 has become a stud of the via 108 and the portion of the metal deposited in the trough 116 has become the interconnect 106. The foregoing discussion of the oversizing of the void 144 in the first mask of the layer 112B applies also to alignment of the via 108 with the element 104. By way of example, and as shown in FIG. 37, the longitudinal dimension of the element 104 is perpendicular to the longitudinal dimension of the interconnect 102. The foregoing manufacturing process has facilitated alignment of the various masks which delimit and locate the interconnect 106 and the via 108 with the element 104 maximizing the cross-sectional area of their intersection.

Figure 41:
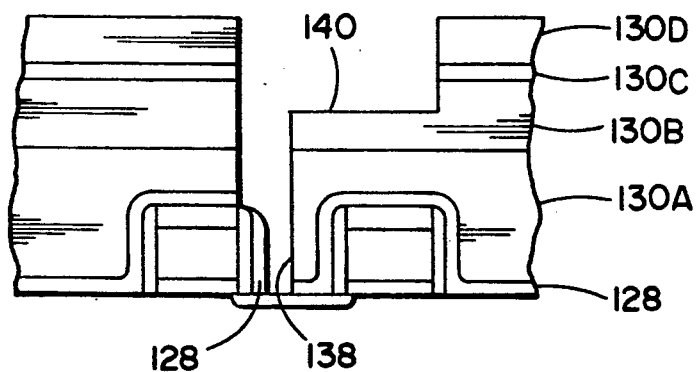
Figure 42:
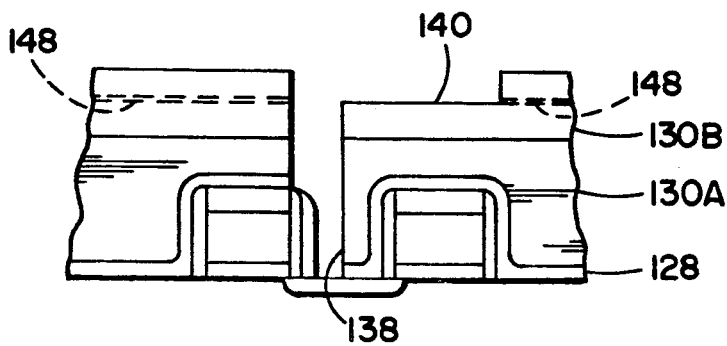
Figure 43:
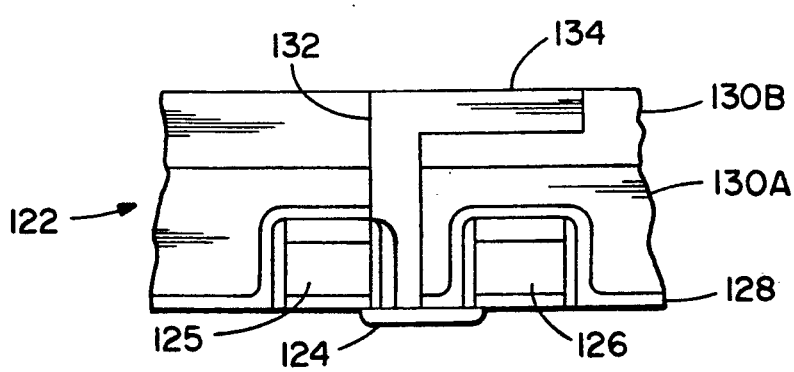

FIGS. 38–43 show steps in an alternative method of manufacture of a chip 122, a fragmentary portion thereof being shown in FIG. 43. By way of example, the chip 122 includes a device region 124 having the structure of the junction of a transistor, and gate electrode stacks 125 and 126 associated with region 124. The devices are covered by a covering 128. The covering 128 is fabricated of an inorganic etch stop such as silicon nitride or TEOS (tetraethyloxysilane) or PSG (phosphosilicon glass). A first insulator layer 130A is disposed on top of the covering 128, and a second insulator layer 130B is disposed on top of the insulator layer 130A. Both of the insulator layers 130A and 130B are fabricated of organic insulating material. However, the layer 130B differs from the layer 130A in that the layer 130B contains also silicon blended with the organic material while none of the silicon is present in the layer 130A. By way of example, a suitable organic insulation material for the layer 130A is available commercially, being provided by DUPONT as type 5810 polyimide precurser. Also included in the chip 122 is an electrically conducting path 132 having the same general configuration as the path 102 of FIG. 37. The path 132 of FIG. 43 includes a horizontally disposed interconnect 134 and a vertically disposed via 136.

Figure 38:
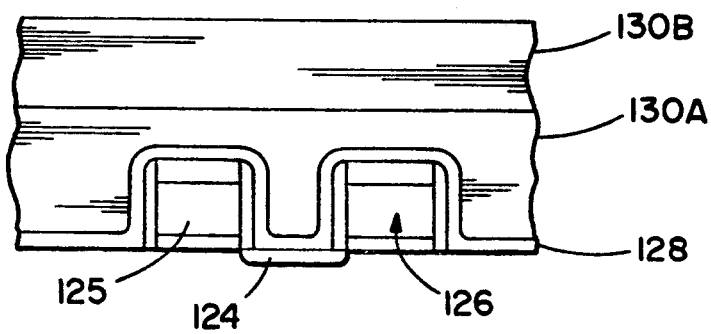
FIGS. 38-43 show diagrammatically a succession of steps in a second embodiment of the method of the invention for constructing an electrically conducting path having a horizontal interconnect and a via extending to a circuit element of a chip.

Construction of the chip 122 begins in FIG. 38 with the formation of the insulator 130A upon the covering 128, this being followed by a planarizing of the top surface 130A. Thereupon, the silicon containing organic material is deposited on top of the layer 130A and processed to form the layer 130B. This produces the structure shown in FIG. 38.

Figure 39:
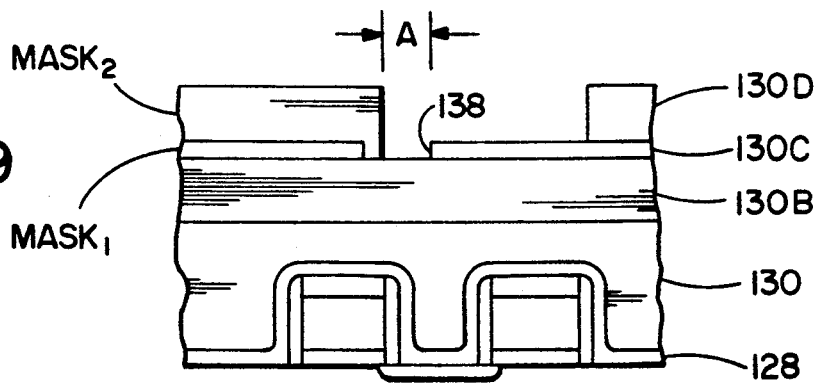

In FIG. 39, the procedure continues with the deposition of a first layer 130C of photoresist upon the insulator layer 130B, and a second layer 130D of photoresist upon the layer 130C. The two layers 130C and 130D of the photoresist are patterned in a manner similar to that disclosed hereinabove in FIG. 9 and, accordingly, the photolithography steps including the deposition of the two layers of photoresist, the masking, the illumination, and the use of the developer of FIGS. 4-9, or steps similar thereto, may be employed herein to provide the patterns in the photoresist layers 130C and 130D, shown in FIG. 39. The layer 130C serves as a first mask for delineating the cross-sectional configuration of the via 136, and the layer 130D serves as a second mask to delineate the configuration of the interconnect 134.

Figure 40:
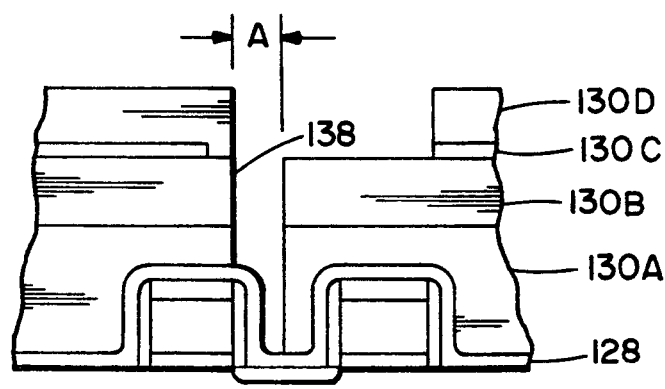

In FIG. 40, the process continues with an etching of the layer 130B. A reactive ion etch (RIE) of carbon tetrafluoride attacks the silicon containing organic insulation material of the layer 130B without substantially attacking either of the photoresist layers 130C and 130D. The etch continues through the layer 130B down to the top surface of the layer 130A where the etching terminates because the non-silicon containing organic insulation material of the layer 130A is not attacked by the etchant. There is an opening 138 with cross-sectional dimension A in the mask of the layer 130C, the opening 138 being extended through the layer 130B by the etching of the layer 130B. Thereafter, the etchant is changed to an oxygen RIE which etches the materials of three of the layers, namely the layers 130A, 130C and 130D. The etching extends the opening 138 through the layer 130A down to the etch stop 128, and also reduces the thickness of the second resist layer 130D and removes the exposed portions of the first resist layer 130C to expose a portion of the top surface of the insulator layer 130B. This produces the structure shown in FIG. 40. It is interesting to note that during the etching of the layer 130 down to the covering 128, the layer 130B has served as a mask to delineate the cross-sectional configuration of the opening 138.

In FIG. 41, the process continues by resuming the carbon tetrafluoride etch which attacks the silicon-containing organic insulation material of the layer 130B and also attacks the material of the etch stop 128. By timing the application of the etchant, the layer 130B is etched down to a level 140 which serves to define the bottom surface of the interconnect 134. During this interval of etching of the layer 130B, the duration of the etch is sufficient to extend the opening 138 through the covering 128 to the bottom of the fragmentary portion of the chip 122 to provide the structure shown in FIG. 41.

In the foregoing etching of the layer 130B to produce the level 140, the location of the level 140 was determined by the duration of the etch. However, it may be desirable in certain applications to define more precisely the location of the level 140.

Figure 44:
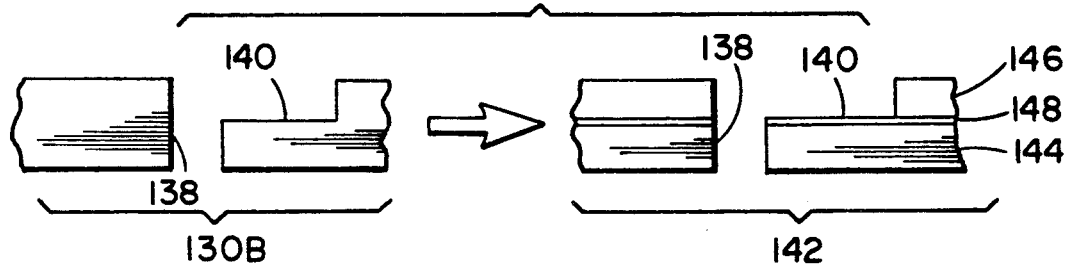
FIG. 44 shows diagrammatically a modification of a sequence of layering and etching steps of the method of FIGS. 38-43 wherein one of the layers is divided into upper and lower portions by means of a thin etch-stop layer.

This can be accomplished by a modification of this embodiment of the method of the invention by constructing the layer 130B, as shown in FIG. 44, as an assembly 142 of three layers, namely, a bottom layer 144 and a top layer 146 which are separated by a relatively thin etch-stop layer 148. The bottom layer 144 and the top layer 146 are both constructed of the organic insulator with the silicon as has been described for the layer 140B. However, the thin etch-stop layer 148 is constructed of the same material employed in the layer 130A, namely, the organic insulation material without the silicon. With the modification of the method as disclosed in FIG. 44, it is necessary to switch back and forth between the carbon tetrafluoride RIE which etches the silicon containing organic insulation and the oxygen RIE which etches the non-silicon containing organic insulation in order to extend the opening 138 past the etch-stop layer 148. However, in the final etching step wherein the level 140 is produced in the layer assembly 142, the timing of the etch is not critical because the etch of the silicon-containing organic insulator of the upper layer 146 proceeds only until the etch-stop layer is reached. The etching of the upper layer 146 is maintained for sufficient time to etch through the covering 128 as has been described above with reference to FIG. 41. The desired location of the level 140 is at the bottom of the etch-stop layer 148, this being accomplished by a further etch, to be described hereinafter, utilizing the oxygen RIE which removes the exposed region of the etch-stop layer 148. This produces the same structure as has been shown in FIG. 41.

At FIG. 42, the method continues with a stripping off of the photoresist layers 130C and 130D by means of oxygen RIE which attacks the photoresist but does not attack the silicon-containing organic insulation material. However, the oxygen RIE does attack the non-silicon-containing organic insulation of the etch-stop layer 148 and, therefore, the step of stripping the photoresist layers 130C and 130D also accomplishes a stripping of the exposed portion of the etch-stop layer 148 of FIG. 44 in the event that the etch-stop layer 148 is employed in the construction of the chip 122. This produces the structure of FIG. 42, which structure may include the optional etch-stop layer 148 indicated in phantom in FIG. 42.

The procedure continues at FIG. 43 wherein metal is deposited within the opening 138 and upon the level 140 to produce, respectively, the stud of the via 136 and the interconnect 134 to provide the electrically conducting path 132 which extends from an upper portion of the chip 122 to make electrical connection with the device 124.

Figure 48:
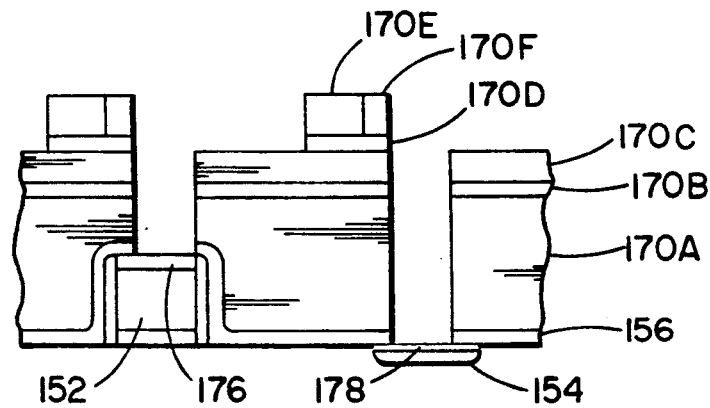
Figure 49:
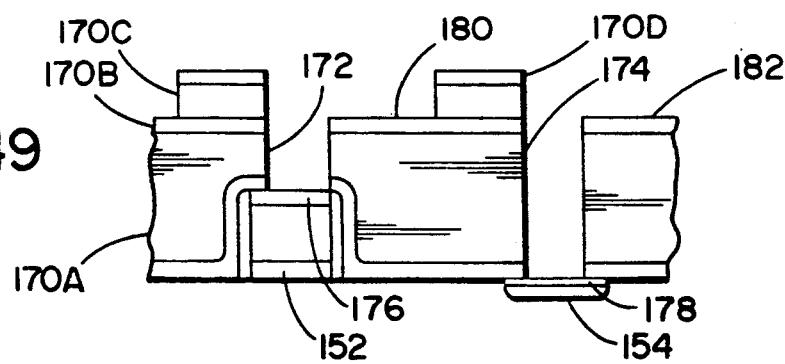
Figure 50:
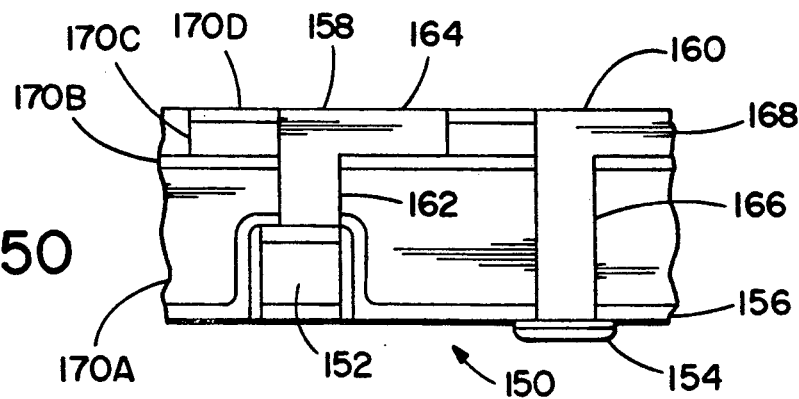

With reference to FIGS. 45-50, there is shown a further embodiment in the method of the invention employed for constructing a circuit chip 150 of which a fragmentary portion is presented in FIG. 50. By way of example in teaching this embodiment of the method, the chip 150 includes an electrically conductive polysilicon region 152 and an electrically conductive diffusion region 154 in the form of a diffusion-doped silicon layer. The regions 152 and 154 are partially covered by a covering 156 of phosphosilicon glass or similar insulating material. Two electrically conducting paths 158 and 160 are provided, the paths 158 and 160 providing electrical conduction between the regions 152 and 154, respectively, and a top surface of the portion of the chip 150 illustrated in FIG. 50. The path 158 comprises a vertically extending via 162 and a horizontally extending interconnect 164. Similarly, the path 160 comprises a via 166 and an interconnect 168. The chip 150 further comprises four layers of insulating material of which two layers having the same material are interleaved with two layers having different material, these layers being an insulator layer 170A, an insulator layer 170B, an insulator layer 170C, and an insulator layer 170D. The layers 170A and 170C are formed of the same material, namely, a polymer insulator which can be etched by oxygen RIE such as a polyimide insulator material made by DUPONT type PI5810. The layers 170B and 170D are constructed as relatively thin layers of inorganic insulation material resistant to oxygen RIE such as TEOS oxide or oxynitride. The layers 170A–D are applied directly one upon the other with the layer 170A being applied to the covering 156.

Figure 45:
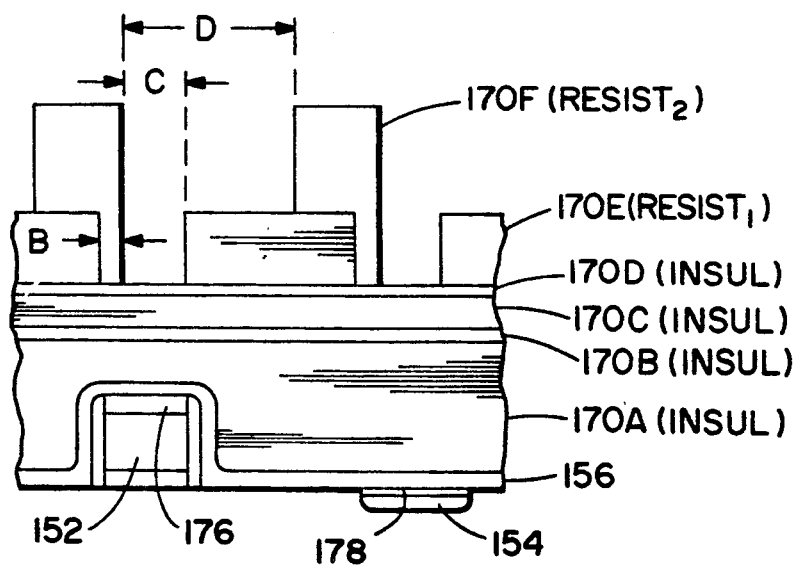
FIGS. 45-50 show diagrammatically, in accordance with a third embodiment of the invention, a method of providing an electrically conductive path having a horizontal interconnect and a vertical via extending from the interconnect to a conductive element.

The procedure for constructing the chip 150 in accordance with this embodiment of the invention begins at FIG. 45. The layer 170A is applied over the silicon nitride covering 156 by conventional means such as by spinning followed by appropriate curing. Planarization is employed upon the top surface of the layer 170. Then, the layer 170B is deposited upon the top surface of the layer 170A to a thickness in the range of 500–1000 angstroms, preferably. The layer 170B may be applied by conventional means, such as chemical vapor deposition. The layer 170C, being of the same material as the layer 170A, is applied to the top surface of the layer 170B, this being followed by a deposition of the layer 170D upon the top of the layer 170C. The construction of the layer 170D is the same as the construction of the layer 170B. The material of the layers 170A and of 170C may be a polymer such as a polyimide. Thereupon, two photoresist layers 170E and 170F are deposited on top of the insulator layer 170D. The structure of the photoresist layers 170E and 170F is similar to that of FIG. 9 and may be formed in accordance with the method steps taught with reference to FIGS. 4–9, the steps including masking, illuminating and the using of developer to remove regions of photoresist exposed to light during the masking processes. The resist layers 170E and 170F serve as masks for delineating portions of the paths 158 and 160. Dimension B (FIG. 45) demonstrates the oversize via in layer 170E trimed by the overlying pattern of layer 170F. The remaining region, indicated by C, establishes an area of a contact hole for development of a stud of the via 162. Dimension D delineates the length of the interconnect 164.

Figure 46:
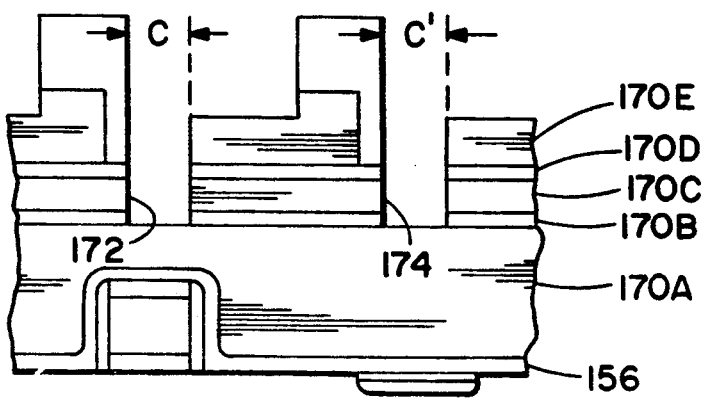

At FIG. 46, the process continues by etching through the layers 170D, 170C and 170B down to the top surface of the layer 170A. In the layer 170D, the etching is accomplished in the regions of the layer 170D exposed by the resist layers 170E and 170F to the etchant. Two such exposed regions C and C' are indicated in FIG. 46. First, the layer 170D is etched with a fluorocarbon, preferably a $CHF_3/CH_4$ reactive ion etch. Then, an oxygen RIE is used to etch the layer 170C. This is followed by a resumption of the fluorocarbon RIE for etching through the layer 170B. These etches are selective etches in that the oxygen RIE does not attack the material of the layers 170B and 170D, and the fluorocarbon RIE does not attack the material of the layers 170A and 170C. The oxygen RIE is also effective to etch the photoresist of the layers 170E and 170F and, accordingly, the use of the oxygen RIE has resulted in a reduction in the thickness of exposed regions of the layers 170E and of 170F. The succession of etching steps produces openings 172 and 174 extending through the layers 170B–D. This produces the structure of FIG. 46.

Figure 47:
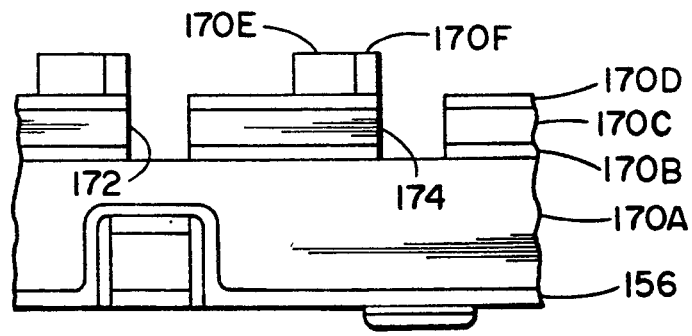

In FIG. 47, the use of the oxygen RIE further etches the photoresist of the layers 170E and 170F with the result that portions of the layer 170E are etched away down to the layer 170D. The layer 170D acts as an etch stop because it is resistant to the oxygen RIE. The process continues with an etching of the layer 170A by oxygen RIE to extend the openings 172 and 174 down to the covering 156. This produces the structure of FIG. 47.

At FIG. 48, the process continues with an etching of the silicon nitride covering 156 by the etching is stopped by silicided contact regions 176 and 178 which are resistant to the etchant. Preferably, the contact regions 176 and 178 are fabricated of cobalt silicide. The etch also etches the exposed regions of the layer 170D down to the top surface of the layer 170C. This produces the structure of FIG. 48.

At FIG. 49, there is further etching with oxygen RIE which etches the exposed region of the layer 170C down to the top surface of the layer 170B. In addition, the oxygen RIE removes the remaining vestiges of the layers 170E and 170F. The exposed regions of the layer 170D and the contact regions 176 and 178 are resistant to the oxygen RIE. This produces the structure of FIG. 49 which includes the openings 172 and 174 for defining the configurations of the vias 162 and 166 and troughs 180 and 182 for defining the configurations of the interconnects 164 and 168.

At FIG. 50, the procedure continues with deposition of a suitable metal, such as aluminum or tungsten, into the openings 172 and 174 and the troughs 180 and 182. The deposited metal provides the via 162 and the interconnect 164 of the electrically conducting path 158, and provides also the via 166 and the interconnect 168 of the electrically conducting path 160. This is the structure of FIG. 50.

With respect to the foregoing embodiments of the invention, it is noted that only fragmentary portions of a chip, or wafer having numerous chips in construction, are presented to facilitate a description of the invention. Typically, other layers of material may be present, and numerous other circuit components are present. With respect to the chip 122 of FIG. 43, it is understood that further layers of material may be present beneath the regions 124 and 126, one such layer being a substrate such as the substrate 110 of FIG. 37. With respect to the chip 150 of FIG. 50, it is understood that further layers of material may be present beneath the regions 152 and 154, one such layer being a substrate such as the substrate 110 of FIG. 37.

The three embodiments of the methodology which has been demonstrated in the production of the chip 100 of FIG. 37, the chip 122 of FIG. 43 and the chip 150 of FIG. 50 share the common feature of the invention in which the steps of the process are clustered to permit a sequence of multiple steps to be produced by the tools of a single workstation before transference to a second workstation having tools for production of a second sequence of multiple steps. As noted above, this feature of the invention facilitates the manufacturing process by avoiding needless transference of workpieces among various workstations. One workstation of considerable interest is in the photolithographic area wherein the workpiece is moved from one masking station to another, and wherein areas of the workpiece are exposed to light through one or more of the masks. Included within the photolithographic workstation are tools for depositing photoresist and for application of developer to remove areas of photoresist which have been exposed to light. Another workstation is employed for the dispensing of etchants and includes tools for implementing various ones of the reactive ion etching procedures. Another workstation provides for chemical vapor deposition of materials utilized in the various layers in the construction of a wafer in which the chip circuits are to be formed, the workstation having also possibly tools for planarizing the surface of a layer of material which has been deposited upon the wafer. It is understood that various tools may be clustered at a workstation, but the foregoing description is representative of the normal clustering of tools at a workstation.

It is to be understood that the above described embodiments of the invention are illustrative only, and that modifications thereof may occur to those skilled in the art. Accordingly, this invention is not to be limited to the embodiments disclosed herein, but is to be limited only as defined by the appended claims.

What is claimed is:

1. A method of forming a recess in a substrate representing a semiconductor interconnect via and a channel pattern as defined by the coincidence of a via image pattern and a channel image pattern comprising the steps of:
    forming a first layer of etchable material having a substantially planar upper surface on a substrate;
    forming a first masking layer on said first layer, said first masking layer being selectively etchable with respect to said first layer;
    selectively removing said first masking layer to expose portions of said first layer at locations of desired via image patterns;
    forming a second masking layer on said exposed first layer and said first masking layer, said second masking layer being selectively etchable with respect to said first layer and to said first masking layer;
    selectively removing said second masking layer to re-expose at least portions of previously exposed portions of said first layer and portions of said first masking layer at locations of desired channel image patterns;
    selectively etching at least a portion of a thickness of said first layer;
    selectively removing exposed portions of said first masking layer to expose additional portions of said first layer; and
    selectively etching said first layer in said additionally exposed portions.

2. A method according to claim 1 wherein the substrate contains previously formed semiconductor devices, and said step of selectively etching said first layer in said additionally exposed portions produces recesses in said first layer, the method further comprising the step of:
    filling the recess at least partially with electrically-conductive material.

3. A method according to claim 2 wherein said step of filling the recess provides for an overfilling of the conductive material to extend over said first layer.

4. A method according to claim 3 further comprising a step of planarizing an upper surface of said first layer and a portion of said conductive material which has overflowed said first layer.

5. A method according to claim 2 further comprising a step of planarizing an upper surface of said first layer and a portion of said conductive material which has overflowed said first layer.

6. A method according to claim 1 wherein said substrate contains semiconductor devices, and wherein said step of forming said first layer is accomplished by use of electrically-insulating material.

7. A method according to claim 6 wherein said insulating material comprises an organic compound.

8. A method according to claim 1 wherein, in said step of forming said first layer of etchable material, said forming is accomplished by producing at least two selectively etchable insulator layers.

9. A method according to claim 8 wherein said step of etching a portion of the thickness of said first layer provides for an etching of said first layer to a depth sufficient to at least penetrate a layer of insulating material nearest to an upper surface of said first layer.

10. A method according to claim 8 further comprising a step of forming an etch stop layer within said first layer between at least two selectively etchable insulator layers.

11. A method according to claim 10 wherein said step of selectively etching said first layer in said additionally exposed portions is accomplished by etching said first layer to a depth sufficient to expose said etch stop layer.

12. A method for configuring an insulator layer for receiving an electrically conductive path suitable for connection to a chip circuit element in the construction of an electric circuit chip, the path having a first part in the form of a vertical via and a second part in the form of a horizontal interconnect, the method comprising steps of
    providing an insulator layer;
    depositing a plurality of masking layers on said insulator layer, said insulator layer being located between said plurality of masking layers and said circuit element, one of said masking layers overlying another of said masking layers;
    patterning said masking layers to form a plurality of masks, a first of said masks defining a surface configuration of at least the first part of said path and a second of said masks defining a surface configuration of at least the second part of said path;
    a first etching step comprising etching said insulator layer by directing etchant through said plurality of masks in a production of a void with the configuration of said path;
    a first removing step comprising removing a portion of at least one of said masks;
    a second etching step comprising a further etching of said insulator layer to produce the void with the configuration of said path;
    a second removing step comprising a removing of remaining portions of said plurality of masks; and
    wherein said depositing and said patterning of masking layers are accomplished prior to said etching and said removing steps.

13. A method according to claim 12 further comprising a step of depositing electrically conductive material in said void to form said path.

14. A method according to claim 12 wherein
    in said step of depositing a plurality of masking layers, there is a step of depositing a first of said masking layers for producing said first mask and a later step of depositing a second of said masking layers to produce said second mask;

in said step of patterning said masking layers, there is a step of patterning said first masking layer and a later step of patterning said second masking layer; and said step of patterning said first masking layer is accomplished before said step of depositing said second masking layer.

15. A method according to claim 14 wherein said patterning of said first masking layer is accomplished by depositing a photoresist layer upon said first masking layer;

exposing said photoresist layer via a photolithographic mask to form a passage for etchant;

removing exposed areas of the photoresist layer to form a passage for etchant; and etching said first masking layer through the passage of the photoresist layer.

16. A method according to claim 14 wherein one of said masks has an aperture for use in forming the via of said path;

another of said masks has a trough for use in forming the interconnect of said path; and the trough overlies the aperture, and a cross-sectional dimension of the aperture is greater than a cross-sectional dimension of the trough to facilitate alignment of the mask having the aperture with the mask having the trough.

17. A method according to claim 16 wherein said aperture is located in said first mask and said trough is located in said second mask, said second mask overlying said first mask; and said first removing step includes a step of removing a portion of said first mask underlying the trough of said second mask.

18. A method according to claim 17 wherein said aperture of said first mask establishes the locations of opposed sides of a first set of opposed sides of said via and said trough establishes locations of opposed sides in a second set of opposed sides of said via perpendicular to said first set of opposed sides of said via.

19. A method according to claim 18 wherein said first etching step and said first removing step and said second etching step and said second removing step are accomplished by use of a set of etchants, the set of etchants having a plurality of different etchants.

20. A method according to claim 19 wherein an etchant of said set of etchants employed in said first etching step operates selectively on said insulator layer while maintaining integrity of said first mask.

21. A method according to claim 19 wherein the etchant of said set of etchants employed in said first etching step operates selectively on said first mask while maintaining integrity of said second mask and said insulating layer.

22. A method according to claim 19 further comprising a step of depositing electrically conductive material in said void to form said path.

23. A method according to claim 12 wherein said first etching step and said first removing step and said second etching step and said second removing step are accomplished by use of a set of etchants, the set of etchants having a plurality of different etchants.

24. A method according to claim 23 wherein an etchant of said set of etchants employed in said first etching step operates selectively on said insulator layer while maintaining integrity of said first mask.

25. A method according to claim 23 wherein the etchant of said set of etchants employed in said first etching step operate selectively on said first mask while maintaining integrity of said second mask and said insulating layer.

26. A method according to claim 23 wherein said step of patterning said masking layers is performed at a workstation; and said first etching step and said first removing step and said second etching step and said second removing step are performed at a workstation separate from the workstation of said patterning step.

27. A method according to claim 12 wherein said first etching step and said first removing step and said second etching step and said second removing step are accomplished by use of a set of etchants, the set of etchants having a plurality of different etchants;

said insulator layer comprises an upper portion contiguous one of said masking layers and a lower portion disposed between said upper portion and said circuit element, the upper portion and the lower portion of said insulator layer being formed of different materials to permit selective etching of the upper and the lower portions of said insulator layer; and a first etchant of said first etching step operates selectively on the upper portion of said insulator layer while maintaining integrity of the lower portion of said insulator layer and a masking layer contiguous the upper portion of said insulator layer.

28. A method according to claim 27 wherein a second etchant of said set of etchants is employed in said first removing step to accomplish said removing of said portion of said at least one of said masks while maintaining integrity of the upper portion of said insulator layer.

29. A method according to claim 28 wherein said second etchant is employed in said second etching step to attack the lower portion of said insulator layer.

30. A method according to claim 29 wherein said insulator layer includes a glass or TEOS interfacing layer which covers at least a portion of said circuit element, the upper portion of said insulator layer being an organic material with silicon, and the lower portion of said insulator layer being an organic material without silicon; and the method further comprising a third etching step of etching said interfacing layer with said first etchant, said third etching step cooperating with said ± first and said second etching steps in creating said void and in extending said void to said circuit element.

31. A method according to claim 30 wherein said providing step provides the upper portion of said insulator layer with a stratum which divides the upper portion of said insulator layer into an upper level contiguous said masking layers and a lower level contiguous a layer of said masking layers and a lower level contiguous the lower portion of said insulation layer, the stratum being formed of the same material as the lower portion of said insulator layer and being etchable by said second etchant, the stratum marking a lower boundary of the interconnect part of said path.

32. A method according to claim 12 wherein said first etching step and said first removing step and said second etching step and said second removing step are accomplished by use of a set of etchants, the set of etchants having a plurality of different etchants;

said insulator layer comprises four strata of insulation materials arranged sequentially between said circuit element and said plurality of masking layers, contiguous ones of said strata being formed of different materials responsive selectively to different etchants of said set of etchants;

the method includes a third etching step between said second etching step and said second removing step; and etchants of said first etching step and of said first removing step and of said second etching step and of said third etching step, respectively, etch successive ones of said strata beginning at a stratum contiguous said plurality of masking layers.

33. A method according to claim 32 wherein alternate ones of said strata are constructed of the same material, an etchant employed in said first etching step is employed also in said second etching step, and an etchant employed in said first removal step is employed also in said third etching step.

34. A method according to claim 33 wherein
said insulator layer includes a glass or TEOS interfacing layer which covers at least a portion of said circuit element, the upper portion of said insulator layer being an organic material with silicon and the lower portion of said insulator layer being an organic material without silicon; and
said second removing step also etches said interfacing layer to extend the via part of said void to contact said circuit element.

35. A method according to claim 32 wherein said third etching step etches a portion of said first mask to expose a region of an uppermost one of said strata contiguous said plurality of masking layers, said region of said uppermost stratum serving to define a lower surface of the interconnect part of said electrically conductive path.

* * * * *